United States Patent
Colinge et al.

(10) Patent No.: US 10,062,779 B2
(45) Date of Patent: Aug. 28, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Jean-Pierre Colinge, Hsinchu (TW); Carlos H. Diaz, Mountain View, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/720,721

(22) Filed: May 22, 2015

(65) Prior Publication Data
US 2016/0343857 A1    Nov. 24, 2016

(51) Int. Cl.
H01L 29/78    (2006.01)
H01L 21/02    (2006.01)
H01L 29/66    (2006.01)

(52) U.S. Cl.
CPC ...... H01L 29/7845 (2013.01); H01L 21/0262 (2013.01); H01L 21/02532 (2013.01); H01L 21/02592 (2013.01); H01L 21/02667 (2013.01); H01L 29/66545 (2013.01); H01L 29/66795 (2013.01); H01L 29/7851 (2013.01)

(58) Field of Classification Search
CPC ............... H01L 29/785; H01L 29/7853; H01L 29/66795; H01L 29/41791; H01L 27/0886; H01L 27/0924
See application file for complete search history.

(56) References Cited

U.S. PATENT DOCUMENTS

| | | |
|---|---|---|
| 7,667,271 B2 | 2/2010 | Yu et al. |
| 7,910,453 B2 | 3/2011 | Xu et al. |
| 8,377,779 B1 | 2/2013 | Wang |

(Continued)

FOREIGN PATENT DOCUMENTS

| | | |
|---|---|---|
| CN | 103855022 A | 6/2014 |
| JP | 2006-196821 A | 7/2006 |

(Continued)

OTHER PUBLICATIONS

Office Action Taiwanese Patent Application No. 10521030100 dated Aug. 22, 2016.

(Continued)

*Primary Examiner* — Steven Loke
*Assistant Examiner* — Scott Stowe
(74) *Attorney, Agent, or Firm* — McDermott Will & Emery LLP

(57) ABSTRACT

A method of manufacturing a Fin FET includes forming a fin structure over a substrate. The fin structure includes an upper layer, and part of the upper layer is exposed from an isolation insulating layer. A gate structure is formed over part of the fin structure. An amorphous layer is formed over the gate structure and the fin structure not covered by the gate structure. A recrystallized layer is formed by partially recrystallizing the amorphous layer over the fin structure not covered by the gate structure. A remaining amorphous layer which is not recrystallized is removed. Source and drain electrode layers are formed over the recrystallized layer.

14 Claims, 13 Drawing Sheets

(56) References Cited

U.S. PATENT DOCUMENTS

| | | |
|---|---|---|
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2005/0101069 A1 | 5/2005 | Mathew et al. |
| 2006/0157749 A1 | 7/2006 | Okuno |
| 2009/0321841 A1 | 12/2009 | Hoentschel et al. |
| 2011/0147840 A1 | 6/2011 | Cea et al. |
| 2011/0278676 A1 | 11/2011 | Cheng et al. |
| 2013/0187228 A1* | 7/2013 | Xie .............. H01L 29/785 257/347 |
| 2014/0001574 A1 | 1/2014 | Chen et al. |
| 2014/0110755 A1 | 4/2014 | Colinge |
| 2014/0151812 A1 | 6/2014 | Liaw |
| 2014/0284666 A1 | 9/2014 | Grupp et al. |
| 2015/0115371 A1 | 4/2015 | Ganz et al. |

FOREIGN PATENT DOCUMENTS

| | | |
|---|---|---|
| JP | 2007510308 A | 4/2007 |
| KR | 10-2011-0038652 A | 4/2011 |
| TW | 201340218 A | 10/2013 |

OTHER PUBLICATIONS

Office Action Korean Patent Application No. 10-2015-0157546 dated Oct. 21, 2016 with English translation.
Final Action Korean Patent Application 10-2015-0157546 dated Apr. 11, 2017 with English translation.
Lau S. S., et al., "Improvement of crystalline quality of epitaxial Si layers by ion-implantation techniques", Applied Physics Letters vol. 34, p. 76, 1979.
Amano, Jun et al., "A novel three-step process for low-defect-density silicon on sapphire", Applied Physics Letters vol. 39, p. 163, 1981.
Vasudev, P. K. et al., "Characterization of CMOS Devices in 0.5-µm Silicon-On-Sapphire Films Modified by Solid Phase Epitaxy and Regrowth (SPEAR)", Materials Research Society Symposia Proceedings, vol. 33, p. 35, 1984.
Roulet, M.E. et al., "Electrical Properties of Siliconim Planted Furnace-Annealed Silicon-On-Sapphire Devices", Electronics Letters vol. 15, p. 527, 1979.
Ipri, A.C., "The Properties of Silicon-on-Sapphire Substrates, Devices, and Integrated Circuits", Applied Solid-State Sciences, Supplement 2, Silicon Integrated Circuits, Part A, Academic Press, pp. 253-395, 1981.
Megahed, M., et al., "UTSi CMOS Technology for System-on-Chip Solution", Topical Meeting on Silicon Monolithic Integrated Circuits in RF Systems, Digest of Papers, p. 94, 1988.
Reedy, R. et al., "UTSi CMOS: A Complete RF SOI Solution", Analog Integrated Circuits and Signal Processing vol. 25, Kluwer academic Publishers, p. 171, 2000.
Colinge, Jean-Pierre, "Silicon-on-Insulator technology: Materials to VLSI", 3rd edition, JP Colinge, Springer (Chapter 1), 2004.

* cited by examiner

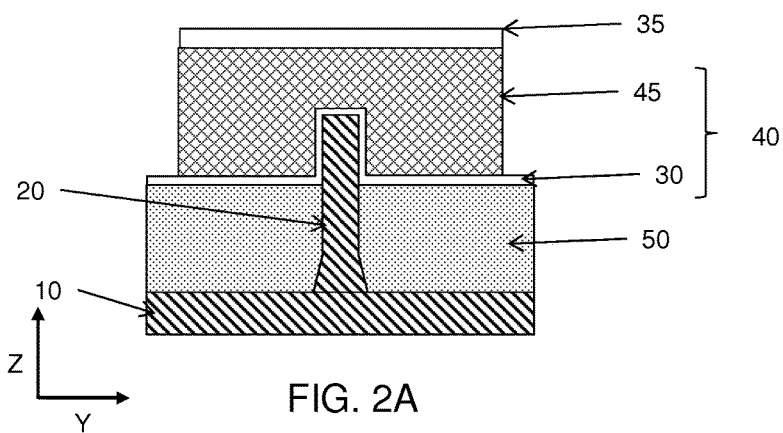
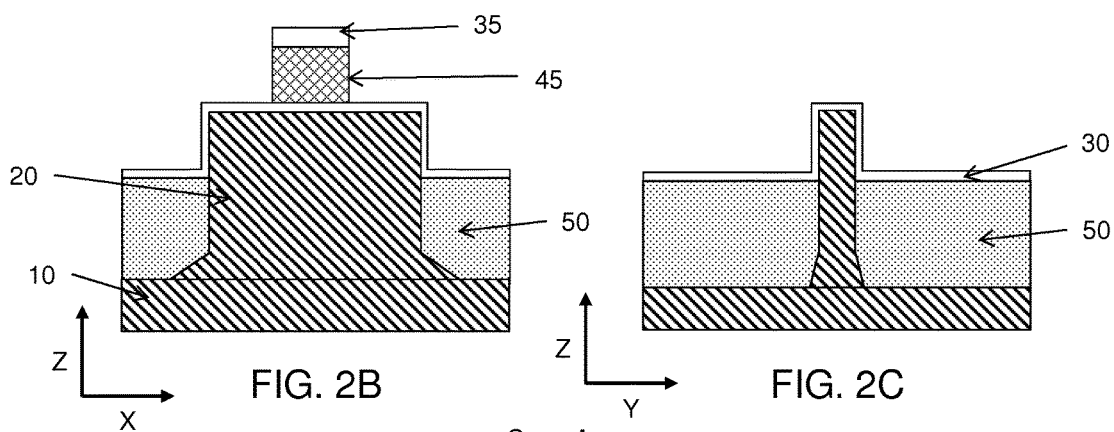
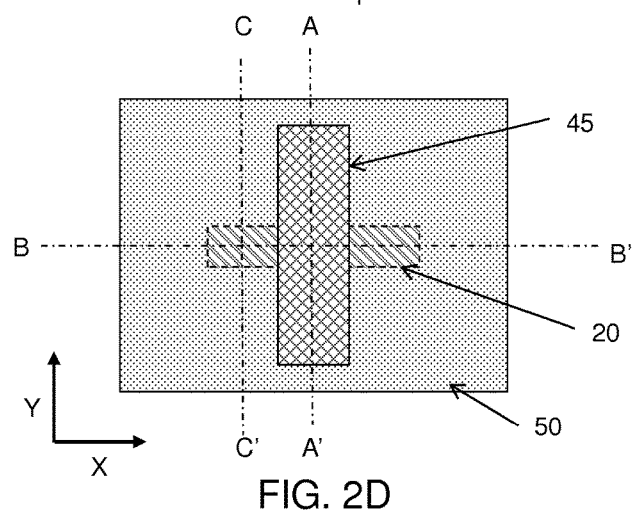

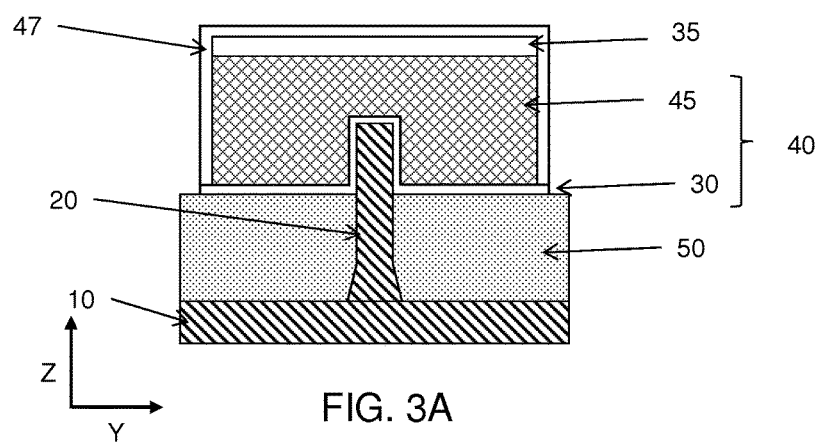
FIG. 3A
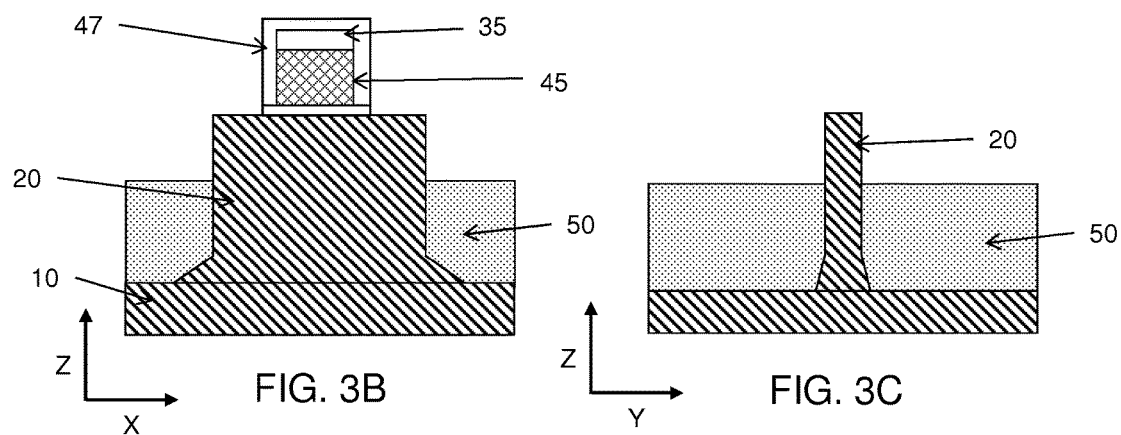
FIG. 3B
FIG. 3C

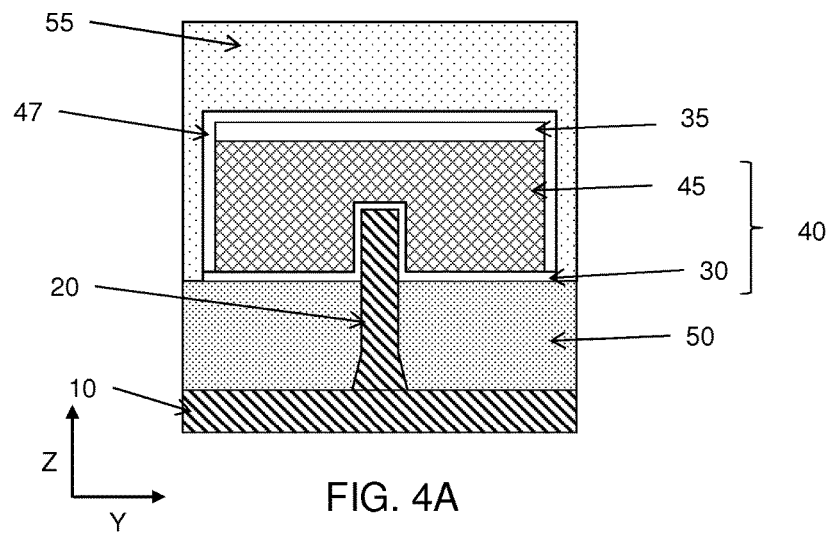
FIG. 4A
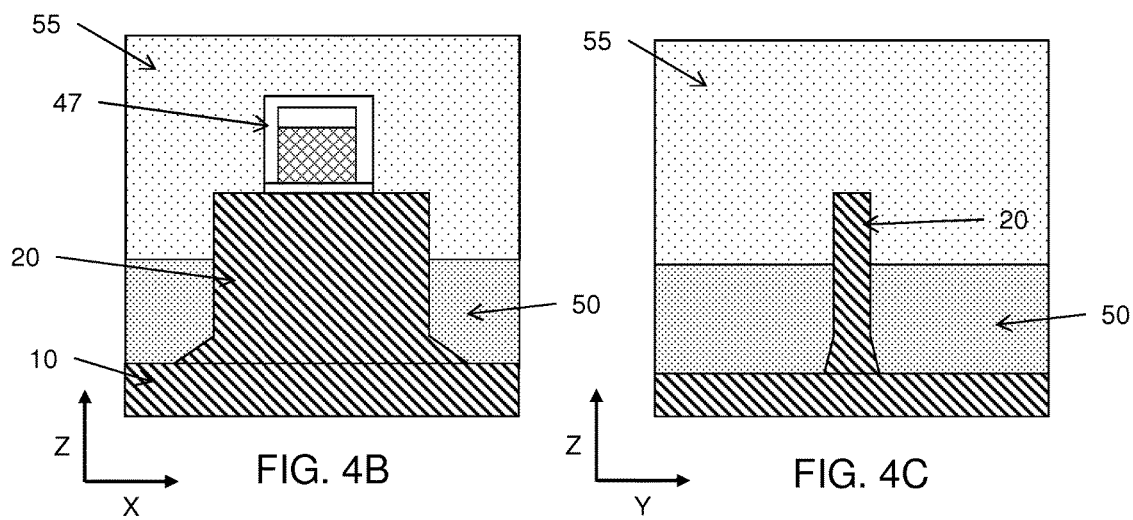
FIG. 4B
FIG. 4C

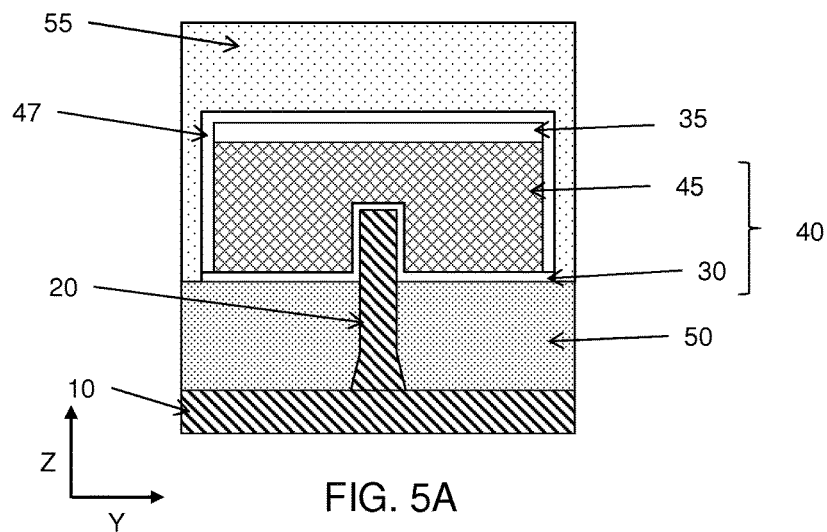
FIG. 5A
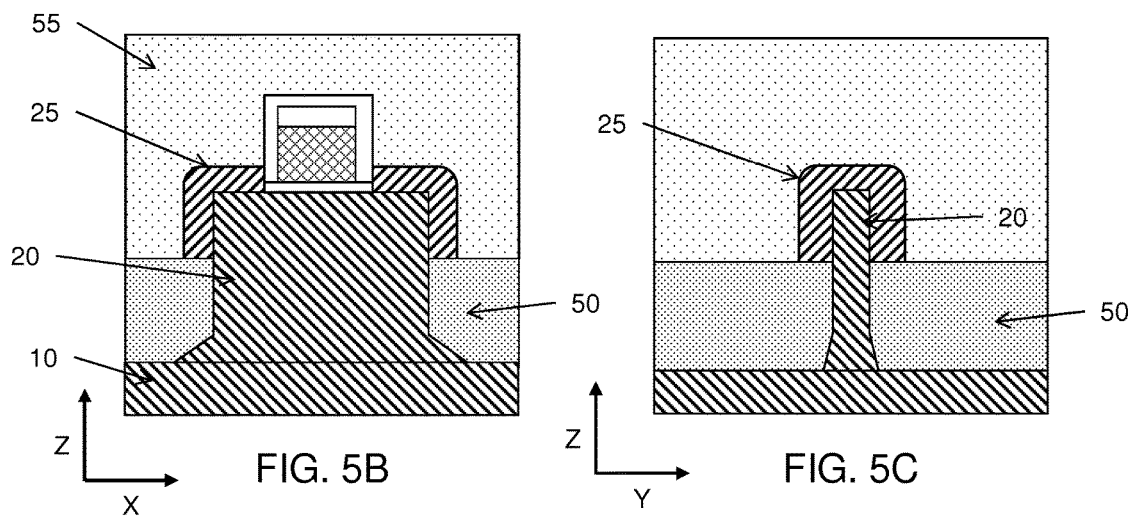
FIG. 5B
FIG. 5C

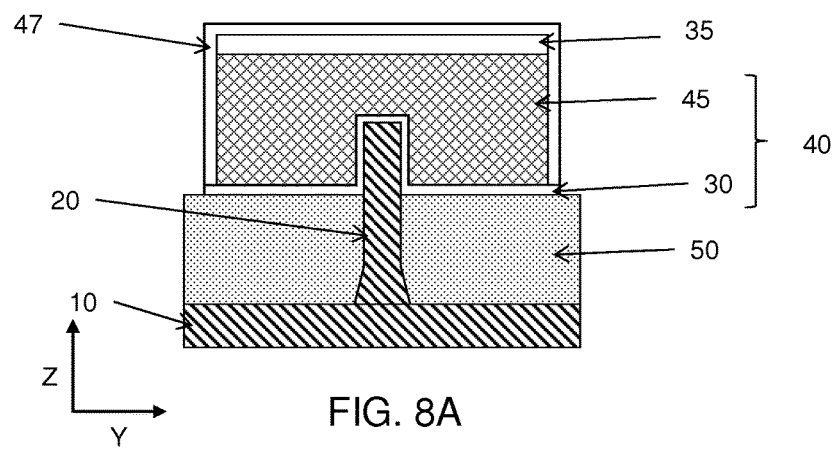
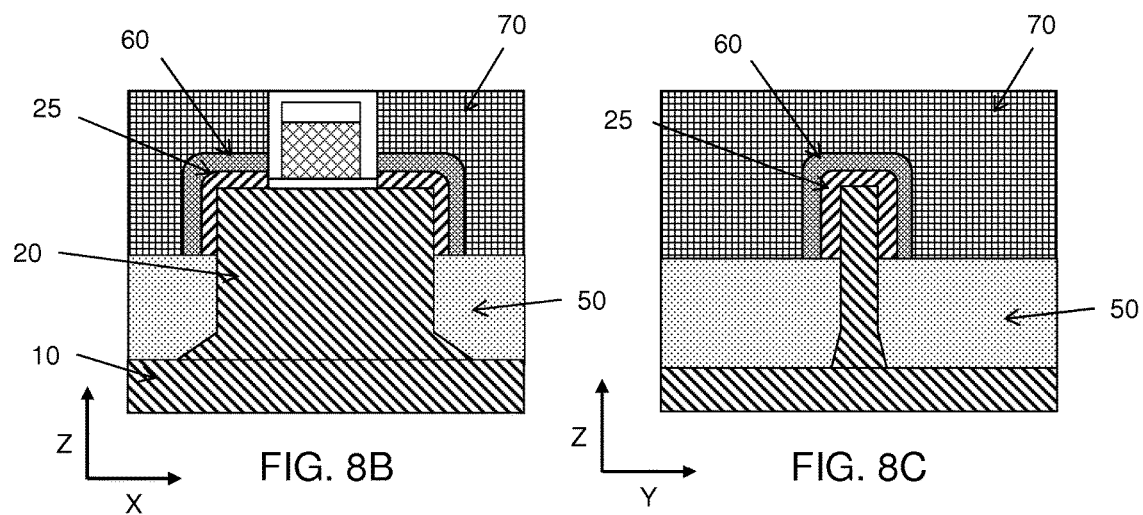
FIG. 8A
FIG. 8B
FIG. 8C

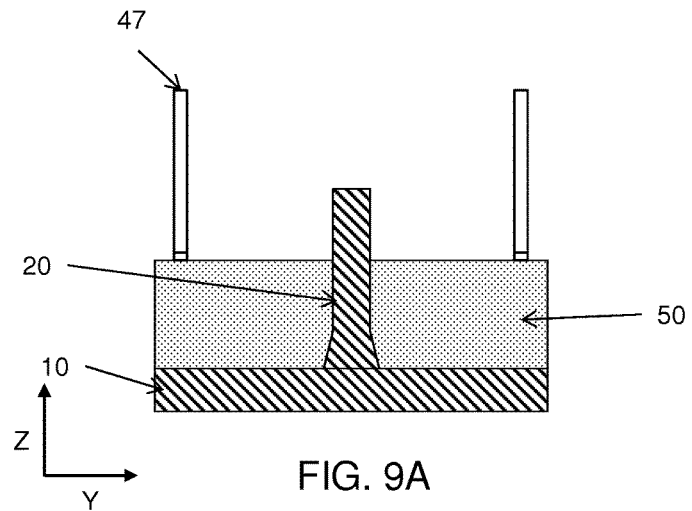
FIG. 9A
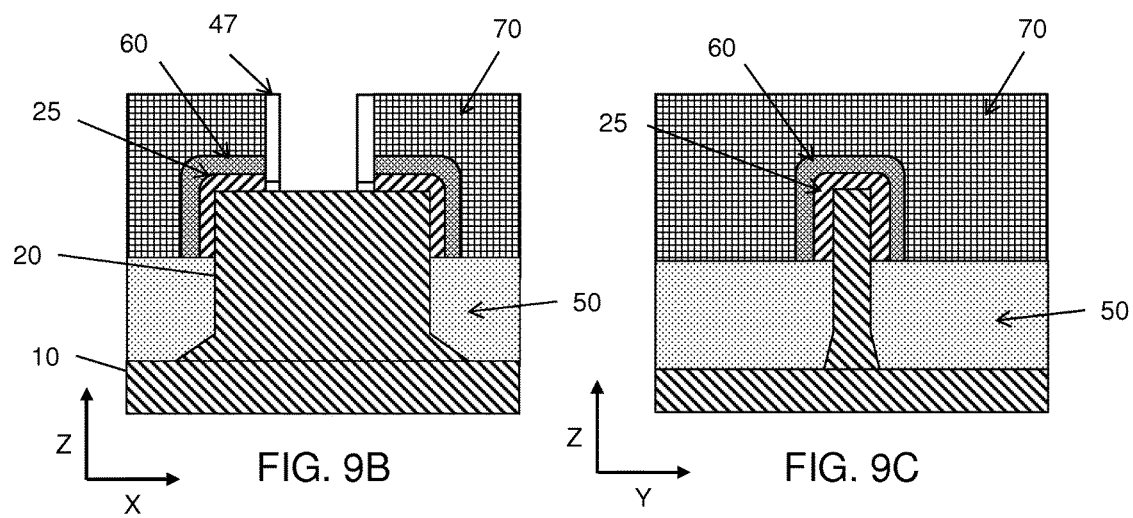
FIG. 9B
FIG. 9C

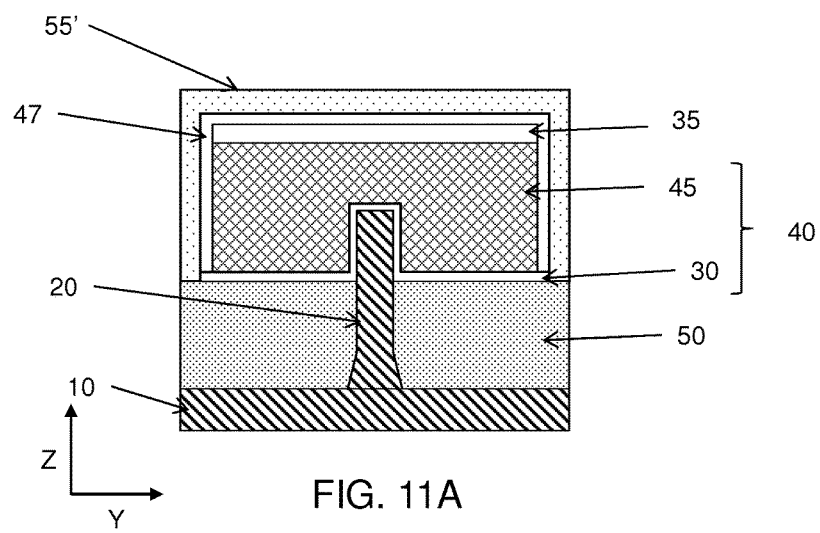
FIG. 11A
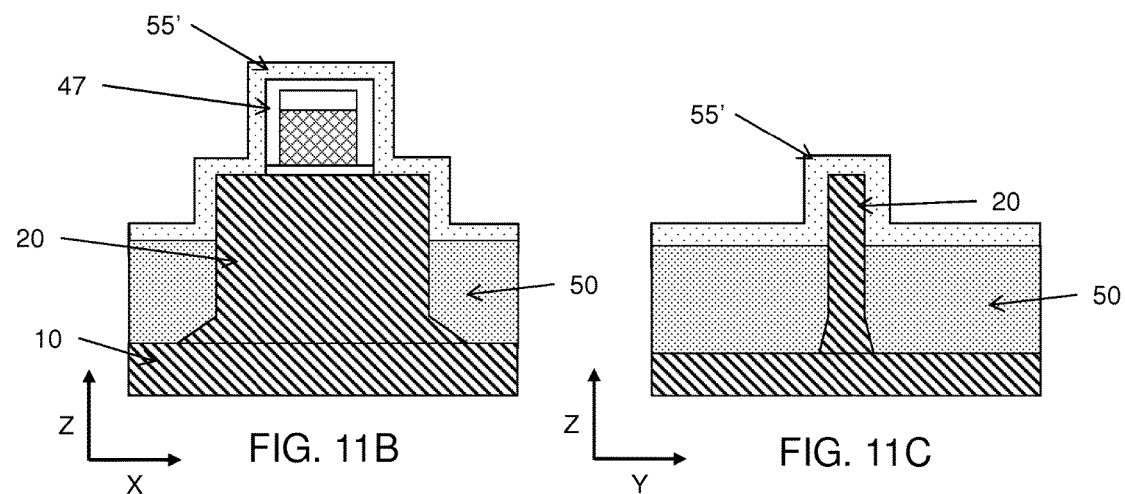
FIG. 11B
FIG. 11C

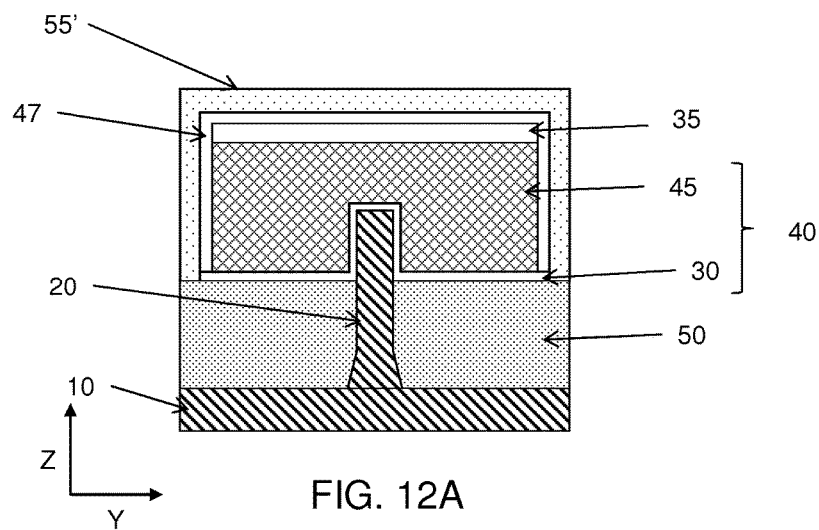
FIG. 12A
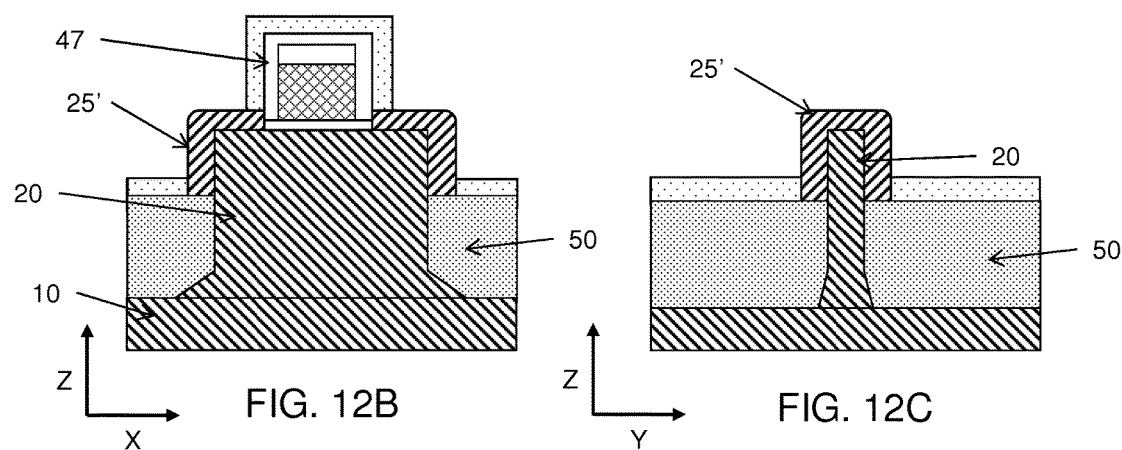
FIG. 12B
FIG. 12C

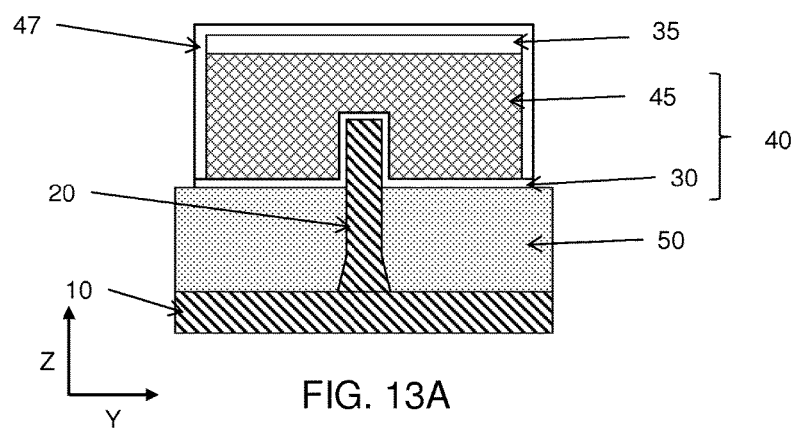
FIG. 13A
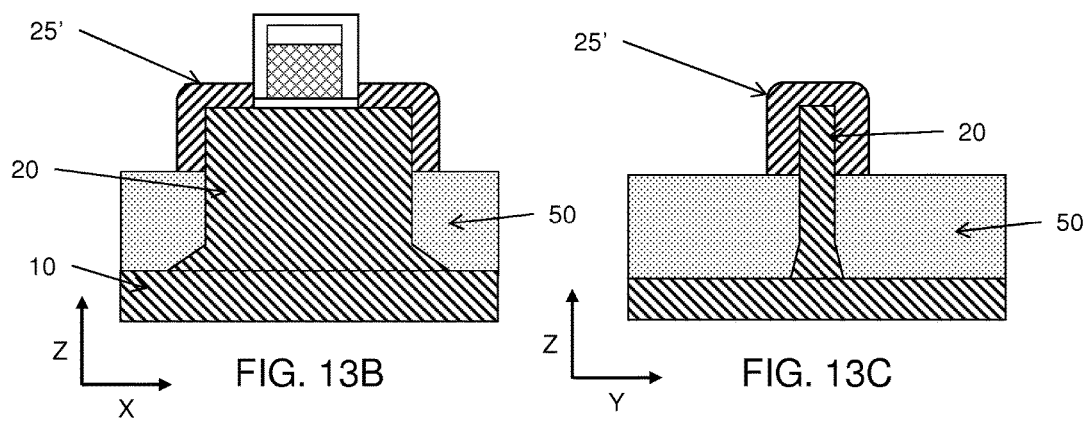
FIG. 13B
FIG. 13C

SEMICONDUCTOR DEVICE AND MANUFACTURING METHOD THEREOF

TECHNICAL FIELD

The disclosure relates to a semiconductor integrated circuit, more particularly to a semiconductor device having a metal gate structure and its manufacturing process.

BACKGROUND

As the semiconductor industry has progressed into nanometer technology process nodes in pursuit of higher device density, higher performance, and lower costs, challenges from both fabrication and design issues have resulted in the use of a metal gate structure with a high-k (dielectric constant) material. The metal gate structure is often manufactured by using gate replacement technologies, and source and drain are formed in a recessed fin by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-10C show exemplary views of various stages for manufacturing a semiconductor FET device according to one embodiment of the present disclosure.

FIGS. 11A-13C show exemplary views of various stages for manufacturing a semiconductor FET device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
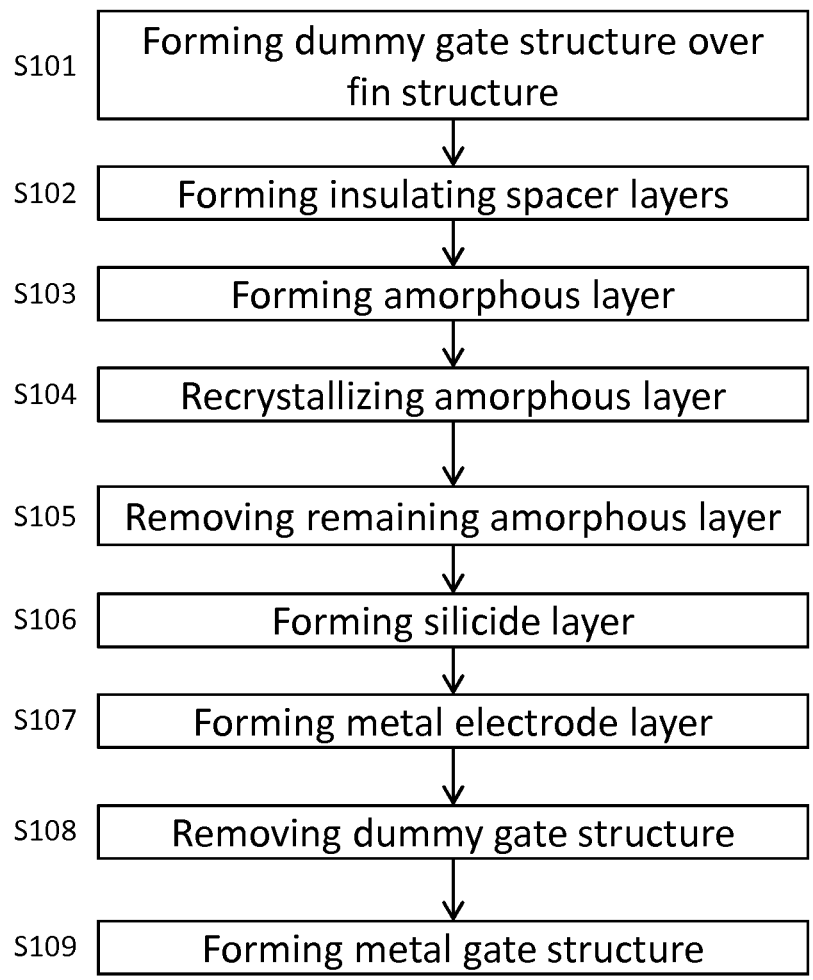
FIG. 1 is an exemplary flow chart for manufacturing a semiconductor FET device according to one embodiment of the present disclosure.

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after processes shown by FIG. 1, and some of the operations described below can be replaced or eliminated for additional embodiments of the method. The order of the operations/processes may be interchangeable.

The following embodiments mainly describe a Fin FET device as one example of the semiconductor device and the manufacturing method thereof, and the technologies described herein are also applicable to horizontal multi-gate transistors, stacked nanowire transistors and/or tri-gate transistors.

FIGS. 2A-2C are exemplary cross sectional views and FIG. 2D is a planar view of a Fin FET device at one of the various stages of the fabrication process according to one embodiment of the present disclosure. FIG. 2A is a cross sectional view along the line A-A' of FIG. 2D, FIG. 2B is a cross sectional view along the line B-B' of FIG. 2D, and FIG. 2C is a cross sectional view along the line C-C' of FIG. 2D.

In S101 of FIG. 1, a dummy gate structure 40 is formed. A fin structure 20 is fabricated over a substrate 10. The fin structure 20 is formed over a substrate 10 and protrudes from an isolation insulating layer 50. The portion of the fin structure 20 protruding from the isolation insulating layer 50 functions as a channel layer. The dummy gate structure may include a polycrystalline silicon layer.

To fabricate a fin structure according to one embodiment, a mask layer is formed over a substrate 10. The mask layer is formed by, for example, a thermal oxidation process and/or a chemical vapor deposition (CVD) process. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. The mask layer includes, for example, a pad oxide (e.g., silicon dioxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 4 nm to about 40 nm in some embodiments. In certain embodiments, the width of the hard mask patterns is in a range of about 4 nm to about 12 nm.

By using the hard mask pattern as an etching mask, the substrate is patterned into a fin structure 20 by trench etching using a dry etching method and/or a wet etching method. A height of the fin structure 20 is in a range of about 20 nm to about 100 nm. In certain embodiments, the height is in a range of about 30 nm to about 60 nm. When the heights of the fin structures are not uniform, the height from the substrate may be measured from the plane that corresponds to the average heights of the fin structures. The width of the fin structure 20 is in a range of about 4 nm to about 10 nm.

In this embodiment, a bulk silicon wafer is used as the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

As shown in FIGS. 2A-2D, one fin structure 20 extending in the X direction is disposed over the substrate 10. However, the number of fin structures is not limited to one. There may be two, three, four or five or more fin structures. In addition, one or more dummy fin structures may be disposed adjacent to both sides of the fin structure 20 to improve pattern fidelity in the patterning processes. The width of the fin structure 20 is in a range of about 5 nm to about 40 nm in some embodiments, and may be in a range of about 7 nm to about 15 nm in certain embodiments. When multiple fin structures are disposed, the space between the fin structures is in a range of about 8 nm to about 80 nm in some embodiments, and may be in a range of about 7 nm to about 15 nm in other embodiments. One skilled in the art will realize, however, that the dimensions and values recited throughout the descriptions are merely examples, and may be changed to suit different scales of integrated circuits.

In this embodiment, the Fin FET device is a p-type Fin FET. However, the technologies disclosed herein are also applicable to an n-type Fin FET.

After forming the fin structure 20, an isolation insulating layer 50 is formed over the fin structure 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50 over the fin structure 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the channel layer (upper layer) of the fin structure 20 is exposed.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

A dielectric layer and a poly silicon layer are formed over the isolation insulating layer 50 and the exposed fin structure, and then patterning operations are performed so as to obtain a dummy gate structure 40 including a dummy gate electrode layer 45 made of poly silicon and a dummy gate dielectric layer 30. The patterning of the poly silicon layer is performed by using a hard mask 35 including a silicon nitride layer formed over a silicon oxide layer in some embodiments. In other embodiments, the hard mask may include a silicon oxide layer formed over a silicon nitride layer. The dummy gate dielectric layer 30 may be silicon oxide formed by CVD, PVD, ALD, e-beam evaporation, or other suitable process. In some embodiments, the gate dielectric layer 30 may include one or more layers of silicon oxide, silicon nitride, silicon oxy-nitride, or high-k dielectrics. In some embodiments, a thickness of the gate dielectric layer is in a range of about 5 nm to about 20 nm, and in a range of about 5 nm to about 10 nm in other embodiments.

In some embodiments, the dummy gate electrode layer 45 may comprise a single layer or multilayer structure. The dummy gate electrode layer 45 may be doped poly silicon with uniform or non-uniform doping. The dummy gate electrode layer 45 may be formed using a suitable process such as ALD, CVD, PVD, plating, or combinations thereof, and may be followed by a planarization operation such as CMP. In the present embodiment, the width of the dummy gate electrode layer 45 is in the range of about 5 nm to about 40 nm. In some embodiments, a thickness of the gate electrode layer is in a range of about 5 nm to about 200 nm, and may be in a range of about 5 nm to 100 nm.

In S102 of FIG. 1, an insulating spacer (side-wall) layer 47 is formed over part of the dummy gate structure as shown in FIGS. 3A-3C. FIG. 3A is a cross sectional view corresponding to the line A-A' of FIG. 2D, FIG. 3B is a cross sectional view corresponding to the line B-B' of FIG. 2D, and FIG. 3C is a cross sectional view corresponding to the line C-C' of FIG. 2D.

As shown in FIGS. 3A and 3B, a side-wall insulating layer 47 is formed over both main sides of the dummy gate electrode 45. The side-wall insulating layer 47 may include one or more layers of silicon oxide, silicon nitride, silicon oxy-nitride, or other suitable material. The side-wall insulating layer 47 may comprise a single layer or multilayer structure. In this embodiment, silicon nitride ($Si_3N_4$) is used as the side-wall insulating layer 47. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. In some embodiments, the insulating layer remains over the hard mask pattern 35, and in other embodiments, by the anisotropic etching, the insulating layer over the hard mask pattern 35 is removed so that the hard mask pattern 35 is exposed. The thickness of the side-wall insulating layers 47 is in a range of about 5 nm to about 30 nm in some embodiments, and in a range of about 10 nm to about 20 nm in other embodiments. As shown in FIG. 3C, the side wall insulating layer may not be formed over the fin structure that is to become a source and a drain.

In S103 of FIG. 1, an amorphous layer 55 is formed over the structure shown in FIGS. 3A-3C. The amorphous layer 55 is formed so as to fully cover the dummy gate structure 40 and the exposed fin structure 20, as shown in FIGS. 4A-4C. FIG. 4A is a cross sectional view corresponding to the line A-A' of FIG. 2D, FIG. 4B is a cross sectional view corresponding to the line B-B' of FIG. 2D, and FIG. 4C is a cross sectional view corresponding to the line C-C' of FIG. 2D.

The amorphous layer 55 may be made of the same material as the fin structure 20. In one embodiment of the present disclosure, the amorphous layer 55 includes amorphous silicon when the fin structure 20 is made of Si. When the fin structure 20 is made of SiGe (Ge content is in a range of 10% to 90%), the amorphous layer 55 includes amorphous SiGe. It is possible to use a different material as the amorphous layer 55 from the fin structure as long as solid-phase epitaxial growth of a crystalline layer is possible.

Further, when the fin structure 20 is made of Si and the Fin FET is an n-type, the amorphous layer 55 may be made of SiP, SiC or SiCP, which can provide a compressive stress to the channel layer. When the fin structure 20 is made of Si and the Fin FET is a p-type, the amorphous layer 55 may be made of SiGe or SiGeB, which can provide a tensile stress to the channel layer.

The amorphous silicon is heavily doped with an appropriate dopant at an amount of about $2 \times 10^{20}$ $cm^{-3}$ to about $1 \times 10^{21}$ $cm^{-3}$. The dopant for a p-type FET includes boron, and the dopant for an n-type FET includes phosphorous and/or arsenic. The thickness of the amorphous layer 55 may be in a range of about 10 nm to 100 nm, in some embodiments. As shown in FIGS. 4A-4C, the dummy gate structure 40 is fully embedded in the amorphous layer 55.

The amorphous silicon layer 55 may be formed by a CVD method using $SiH_4$, $SiHCl_3$, $SiH_2Cl_2$ and/or $Si_2H_6$ as a source gas. Other gases such as $GeH_4$ may be added to form SiGe amorphous material. An ALD method may also be used. The amorphous silicon is produced by the pyrolysis (thermal decomposition of one of the abovementioned gases) at a temperature between, for example, about 520 and about 620 degrees Celsius and in the pressure range of about 2 to about 300 mTorr.

In S104 of FIG. 1, part of the amorphous layer 55 is recrystallized as shown in FIGS. 5A-5C. This recrystallization is often called as solid-phase epitaxy. FIG. 5A is a cross sectional view corresponding to the line A-A' of FIG. 2D, FIG. 5B is a cross sectional view corresponding to the line B-B' of FIG. 2D, and FIG. 5C is a cross sectional view corresponding to the line C-C' of FIG. 2D.

In the recrystallization operations, the substrate with the dummy gate structure 40 and the fin structure 20 covered by the amorphous layer 55 is heated at a temperature of about 500° C. to about 650° C. in some embodiments, or at a temperature of about 550° C. to 600° C. in other embodiments, when the amorphous layer 55 is amorphous silicon. By this solid-phase epitaxy, a few nanometers of the amorphous silicon are recrystallized into crystal silicon layer 25, by using the fin structure 20 (crystal silicon) as a seed layer. The thickness of the recrystallized silicon is in a range of about 1 nm to about 15 nm. The crystal silicon layer 25 functions as a strain layer. The amorphous layer 55 formed on insulating layers is not recrystallized. A laser annealing or a rapid thermal annealing at a temperature higher than 650° C. may be used to recrystallize the amorphous layer 55 in other embodiments.

When the amorphous layer 55 is amorphous SiGe, the heating temperature may be in a range of about 400° C. to 550° C. in some embodiments. As shown in FIGS. 5A-5C, no crystal silicon is epitaxially formed on portion of insulating layers 47, 50.

As shown in FIGS. 5B and 5C, the recrystallized layer 25 grows substantially uniformly on the top and the side faces of the exposed fin structure 20. The difference of the thickness of the grown recrystallized layer 25 between the side face and the top face may be about 0.2 nm to about 1 nm. If a vapor phase epitaxy is used instead of solid-phase epitaxy as described above, an epitaxially grown layer would grow more laterally than vertically due to different growth rates for crystal orientations of Si, thereby forming a "diamond" shape cross section, which would cause current crowding at the source and drain and reduce the transistor's current drive ability. For example, when the diamond shape is formed, contacts (metal electrode layers) to the source/drain would be disposed only over the upper part of the diamond shape and the side and lower part of the diamond shape would not touch the contacts.

Figure 6A:
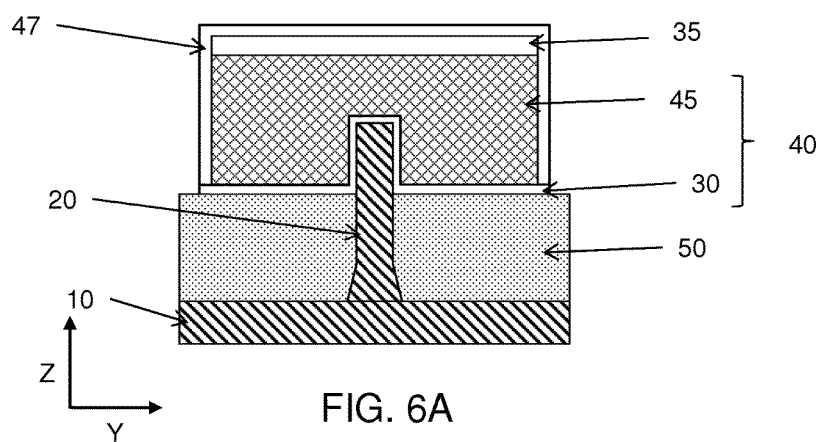
Figure 6B:
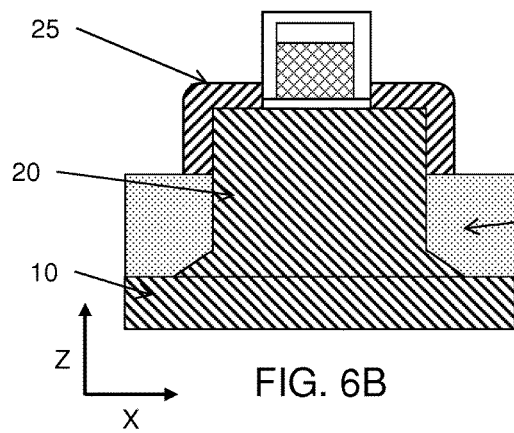
Figure 6C:
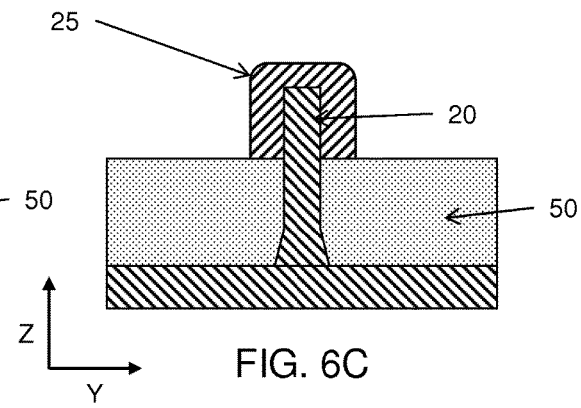

In S105 of FIG. 1, the remaining amorphous layers 55 that are not recrystallized are removed as shown in FIGS. 6A-6C. The non-crystallized amorphous layer is removed by etching operations. FIG. 6A is a cross sectional view corresponding to the line A-A' of FIG. 2D, FIG. 6B is a cross sectional view corresponding to the line B-B' of FIG. 2D, and FIG. 6C is a cross sectional view corresponding to the line C-C' of FIG. 2D.

In case of wet etching, dilute $HNO_3$ and HF is used as an etching solution. A tetramethylammonium hydroxide (TMAH) solution or a potassium hydroxide (KOH) solution may also be used. Dry etching may be used to remove the non-crystallized amorphous layer. As shown in FIGS. 6A-6C, the recrystallized silicon layer 25 covers only the fin structure that is to be a source and a drain.

Figure 7A:
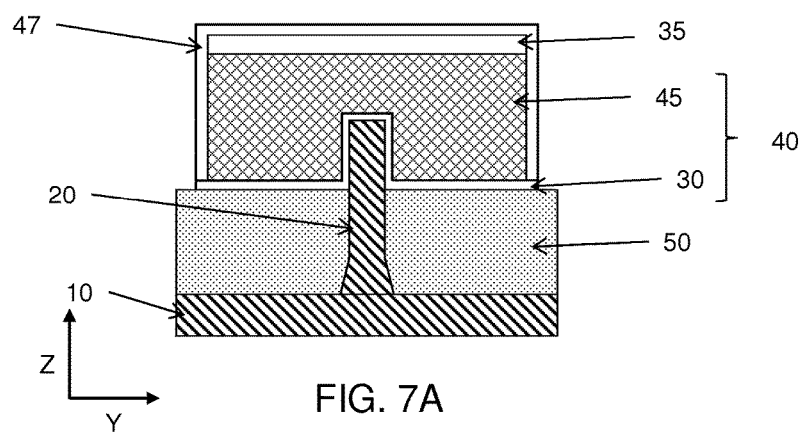
Figures 7B, 7C:
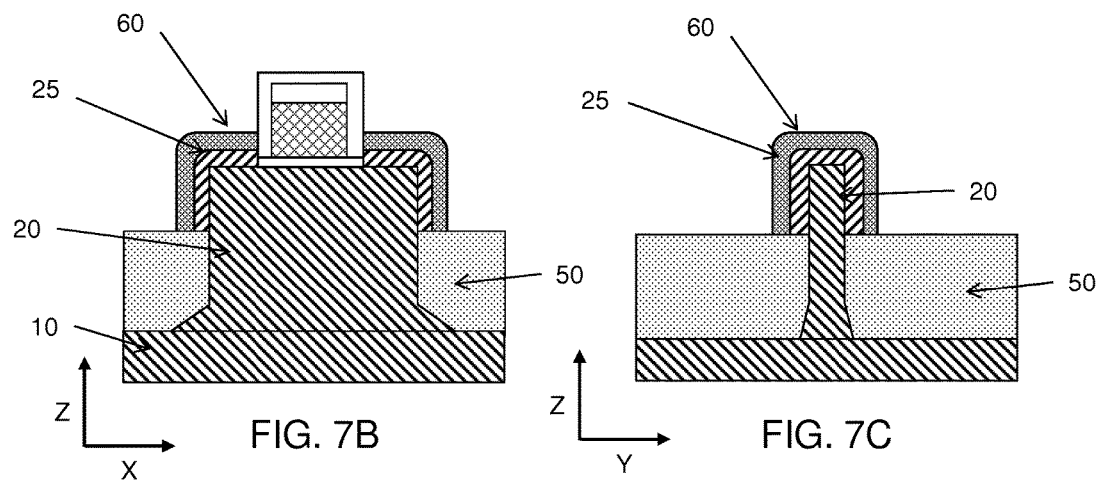

In S106 of FIG. 1, silicide layers are formed over the source/drain regions formed by the recrystallized layer 25 and the fin structure 20 as shown in FIGS. 7A-7C. FIG. 7A is a cross sectional view corresponding to the line A-A' of FIG. 2D, FIG. 7B is a cross sectional view corresponding to the line B-B' of FIG. 2D, and FIG. 7C is a cross sectional view corresponding to the line C-C' of FIG. 2D.

A metal material that forms silicide with silicon (or germanium) is formed over the source/drain region, and a heat treatment is performed to form a silicide layer 60. The metal material includes Co, W, Ti, Ta and/or Ni. In one embodiment of the present disclosure, part of the recrystallized layer 25 becomes the silicide layer 60. The thickness of the silicide layer 60 may be in a range of 1 nm to 5 nm in some embodiments.

In some embodiments, the entire recrystallized layer 25 becomes the silicide layer 60, and further part of the fin structure 20 also becomes the silicide layer 60. In such cases, the thickness of the silicide layer 60 may be in a range of 5 nm to 20 nm in some embodiments.

As shown in FIGS. 7B and 7C, since the recrystallized layer 25 is substantially uniformly grown over the exposed fin structure 20, the silicide layer 60 is also substantially uniformly formed. The difference of the thickness of the silicide layer 60 between the side face and the top face may be about 0.2 nm to about 1 nm.

In S107 of FIG. 1, source/drain (S/D) metal electrode layers 70 are formed over the silicide layer 60 as shown in FIGS. 8A-8C. FIG. 8A is a cross sectional view corresponding to the line A-A' of FIG. 2D, FIG. 8B is a cross sectional view corresponding to the line B-B' of FIG. 2D, and FIG. 8C is a cross sectional view corresponding to the line C-C' of FIG. 2D.

A thick metal material is formed over the silicide layer 60 and the dummy gate structure 40, and planarization operations are performed so that the top surface of the dummy gate structure 40 (the hard mask layer 35) is exposed, as shown in FIGS. 8A-8C. The metal material includes Co, W, Ti, Ta, Cu, Al and/or Ni. The planarization operations include an etch-back process and/or a chemical mechanical polishing (CMP) process.

In S108 of FIG. 1, the dummy gate structure 45 is removed as shown in FIGS. 9A-9C. FIG. 9A is a cross sectional view corresponding to the line A-A' of FIG. 2D, FIG. 9B is a cross sectional view corresponding to the line B-B' of FIG. 2D, and FIG. 9C is a cross sectional view corresponding to the line C-C' of FIG. 2D.

The hard mask layer 35, the dummy gate electrode layer 45 and the dummy dielectric layer 30 are removed, by appropriate etching processes, respectively, to form an opening.

Figure 10A:
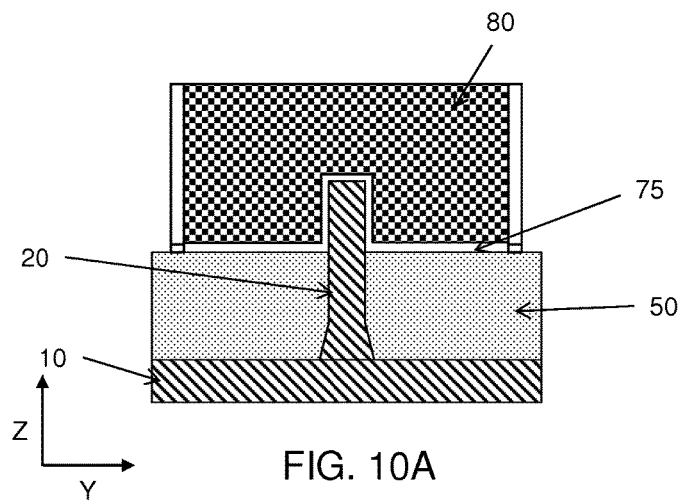
Figure 10B:
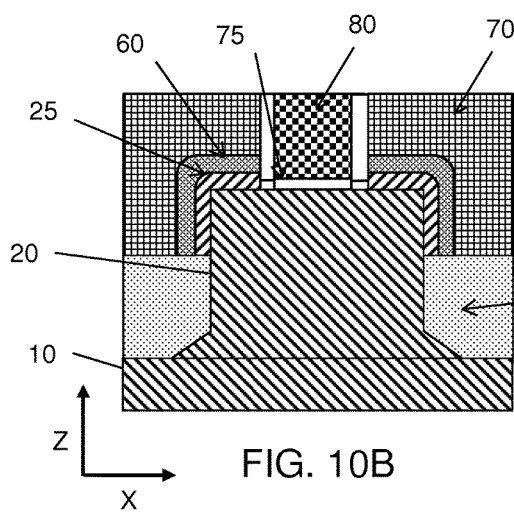
Figure 10C:
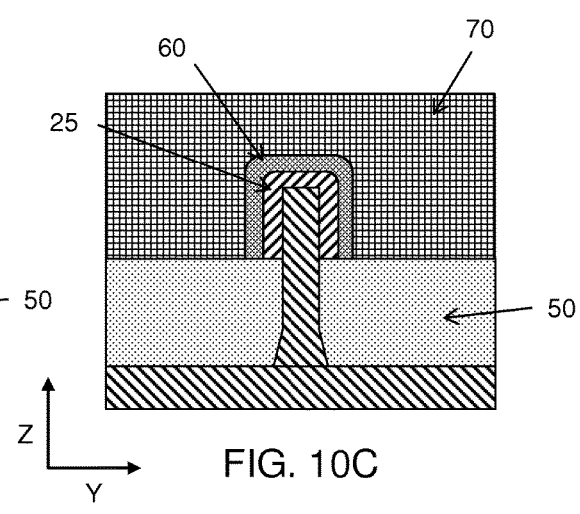

In S109 of FIG. 1, a metal gate structure is formed in the opening created by removing the dummy gate structure as shown in FIGS. 10A-10C. FIG. 10A is a cross sectional view corresponding to the line A-A' of FIG. 2D, FIG. 10B is a cross sectional view corresponding to the line B-B' of FIG. 2D, and FIG. 10C is a cross sectional view corresponding to the line C-C' of FIG. 2D.

A gate dielectric layer 75 and a metal gate layer 80 are formed in the opening, as shown in FIGS. 10A and 10B. A gate dielectric layer 75 is formed over an interface layer (not shown) disposed over the channel layer of the fin structure 20. The interface layer may include silicon oxide with a thickness of 0.2 nm to 1.5 nm in some embodiments. The silicon oxide interface layer may be formed by oxidizing the Si channel layer. In other embodiments, the thickness of the interface layer is in a range about 0.5 nm to about 1.0 nm.

The gate dielectric layer 75 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HMO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 75 is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer 75 is in a range of about 1 nm to about 10 nm in some embodiments, and may be in a range of about 2 nm to about 7 nm in other embodiments. In some embodiments, the gate dielectric layer 75 may include an interfacial layer made of silicon dioxide.

A metal gate electrode 80 is formed over the gate dielectric layer 75. The metal gate electrode 80 include one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer 75 and the gate electrode 80. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

As set forth above, if a vapor phase epitaxial is used instead of solid-phase epitaxy as described above, an epitaxially grown layer would grow more laterally than vertically due to different growth rates for crystal orientations of Si, thereby forming a "diamond" shape cross section. In such a case, the source/drain (S/D) metal electrode layers 70 would not cover the lower part of the S/D regions of the fin structure 20, which causes a higher contact resistance between the S/D metal electrode layers and the S/D regions. In contrast, as shown in FIGS. 10B and 10C, the S/D metal electrode layers 70 cover the entire source/drain regions of the fin structure 20, and the contact resistance between the S/D metal electrode layers 70 and the source/drain regions can be reduced.

In the above embodiment, a gate replacement process is employed. However, the technologies with respect to the solid phase epitaxy as described above are also applicable to a gate-first process. In such a case, S108 and S109 may be omitted.

It is understood that the device shown in FIGS. 10A-10C may undergo further CMOS processes to form various features such as contacts/vias, interconnect metal layers, dielectric layers, passivation layers, etc.

FIGS. 11A-13C show exemplary views of various stages for manufacturing a semiconductor FET device according to another embodiment of the present disclosure. The substantially same and/or similar processes and/or materials as those described above may be applied to this embodiment.

In the foregoing embodiment, in S103 of FIG. 1, a thick amorphous layer 55 is formed over the exposed fin structure 20 and the dummy gate structure 40. In this embodiment, as shown in FIGS. 11A-11C, a thin amorphous layer 55' is formed over the exposed fin structure 20 and the dummy gate structure 40. FIG. 11A is a cross sectional view corresponding to the line A-A' of FIG. 2D, FIG. 11B is a cross sectional view corresponding to the line B-B' of FIG. 2D, and FIG. 11C is a cross sectional view corresponding to the line C-C' of FIG. 2D.

The thin amorphous layer 55' is made of, for example, amorphous Si. The thickness of the thin amorphous layer 55' is in a range of about 0.5 nm to 10 nm in some embodiments, and may be in a range of about 1 nm to 5 nm in other embodiments. The thin amorphous layer 55' is formed conformally over the exposed fin structure 20 and the dummy gate structure 40. Therefore, the thickness of the thin amorphous layer 55' is substantially uniform over the top and side faces of the exposed fin structure 20. The thickness variation may be in a range of about 0.2 nm to about 1 nm.

Similar to S104 of FIG. 1, the thin amorphous layer 55' is recrystallized as shown in FIGS. 12A-12C. The conditions of the recrystallization are substantially same as those described with respect to FIGS. 5A-5C. FIG. 12A is a cross sectional view corresponding to the line A-A' of FIG. 2D, FIG. 12B is a cross sectional view corresponding to the line B-B' of FIG. 2D, and FIG. 12C is a cross sectional view corresponding to the line C-C' of FIG. 2D.

In this embodiment, since the thickness of the amorphous layer 55' is small, the entire amorphous layer 55' is recrystallized over the fin structure 20. Thus, the thickness of the recrystallized layer 25' is in a range of about 0.5 nm to 10 nm in some embodiments, and may be in a range of about 1 nm to 5 nm in other embodiments.

Similar S105 of FIG. 1, the remaining amorphous layers 55' that are not recrystallized are removed as shown in FIGS. 13A-13C. FIG. 13A is a cross sectional view corresponding to the line A-A' of FIG. 2D, FIG. 13B is a cross sectional view corresponding to the line B-B' of FIG. 2D, and FIG. 13C is a cross sectional view corresponding to the line C-C' of FIG. 2D.

As described above, the non-crystallized amorphous layers are removed by wet and/or dry etching operations.

After the removal of the non-crystallized amorphous layers, operations of S106 to S109 are performed.

It is understood that the device shown in FIGS. 13A-13C may undergo further CMOS processes to form various features such as contacts/vias, interconnect metal layers, dielectric layers, passivation layers, etc.

In the present disclosure, by using a solid phase epitaxy, a recrystallized layer substantially uniformly grows on the top and the side faces of the exposed fin structure. The recrystallized layer fully covers the exposed fin structure, the silicide layer also fully covers the recrystallized layer, and therefore the S/D metal electrode layer can cover the entire source/drain regions of the fin structure. Accordingly, the contact resistance between the S/D metal electrode layers and the source/drain regions can be reduced.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a fin structure is formed over a substrate. The fin structure extends in a first direction and includes an upper layer. Part of the upper layer is exposed from an isolation insulating layer. A gate structure is formed over part of the fin structure. The gate structure extends in a second direction perpendicular to the first direction. An amorphous layer is formed over the gate structure and the fin structure not covered by the gate structure. A recrystallized layer is formed by partially recrystallizing the amorphous layer over the fin structure not covered by the gate structure. A remaining amorphous layer which is not recrystallized is removed. Source and drain electrode layers are formed over the recrystallized layer.

In accordance with another aspect of the present disclosure, in a method of manufacturing a semiconductor device including a Fin FET, a fin structure is formed over a substrate. The fin structure extends in a first direction and includes an upper layer. Part of the upper layer is exposed from an isolation insulating layer. A gate structure is formed over part of the fin structure. The gate structure extends in a second direction perpendicular to the first direction. An amorphous layer is formed over the gate structure and the fin structure not covered by the gate structure. A recrystallized layer is formed by recrystallizing the amorphous layer over the fin structure not covered by the gate structure. A remaining amorphous layer which is not recrystallized is removed. Source and drain electrode layers are formed over the recrystallized layer. A thickness of the amorphous layer is adjusted such that in the forming the recrystallized layer, the amorphous layer formed over the fin structure not covered by the gate structure is fully recrystallized.

In accordance with another aspect of the present disclosure, a semiconductor device includes a fin structure disposed over a substrate, a gate structure disposed over part of the fin structure, a source which includes part of the fin structure not covered by the gate structure, and a source electrode in contact with the source. The fin structure extends in a first direction and includes an upper layer. Part of the upper layer is exposed from an isolation insulating layer. The gate structure extends in a second direction perpendicular to the first direction. The source electrode covers entire top and side faces of the source.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
   forming a fin structure over a substrate, the fin structure extending in a first direction and including an upper layer, part of the upper layer being exposed from an isolation insulating layer;
   forming a gate structure over part of the fin structure, the gate structure extending in a second direction perpendicular to the first direction;
   forming an amorphous layer over the gate structure and the fin structure not covered by the gate structure;
   forming a recrystallized layer by recrystallizing the amorphous layer over the fin structure not covered by the gate structure;
   removing a remaining amorphous layer which is not recrystallized; and
   forming source and drain electrode layers over the recrystallized layer, wherein:

a thickness of the amorphous layer is controlled such that in the forming the recrystallized layer, the amorphous layer formed over the fin structure not covered by the gate structure is fully recrystallized and no amorphous layer remains on a top of the fin structure after the recrystallization and prior to the removing the remaining amorphous layer.

2. The method of claim 1, further comprising:
before forming the source and drain electrode layers, forming a silicide layer over the recrystallized layer.

3. The method of claim 2, wherein in forming the silicide layer, part of the recrystallized layer is formed into the silicide layer.

4. The method of claim 2, wherein the silicide layer covers entire top and side faces of the recrystallized layer formed on the part of the upper layer of the fin structure not covered by the gate structure.

5. The method of claim 2, wherein:
the gate structure is a dummy gate structure, and
the method further comprises:
removing the dummy gate structure after forming the source and drain electrode layers to form an opening; and
forming a metal gate structure in the opening.

6. The method of claim 5, wherein the amorphous silicon is doped with impurities at an amount of $2\times10^{20}$ cm$^{-3}$ to $1\times10^{21}$ cm$^{-3}$.

7. The method of claim 2, wherein the forming the recrystallized layer is performed at a temperature of 500° C. to 600° C.

8. The method of claim 2, wherein at least one of the source and drain electrode layers covers entire top and side faces of the silicide layer.

9. A method of manufacturing a semiconductor device including a Fin FET, the method comprising:
forming a fin structure over a substrate, the fin structure extending in a first direction and including an upper layer, part of the upper layer being exposed from an isolation insulating layer;
forming a gate structure over part of the fin structure, the gate structure extending in a second direction perpendicular to the first direction;
forming an amorphous layer over the gate structure and the fin structure not covered by the gate structure;
forming a recrystallized layer by partially recrystallizing the amorphous layer over the fin structure not covered by the gate structure;
removing a remaining amorphous layer which is not recrystallized;
forming a silicide layer over the recrystallized layer; and
forming source and drain electrode layers over the silicide layer, wherein:
the silicide layer covers entire top and side faces of the recrystallized layer formed on the part of the upper layer of the fin structure not covered by the gate structure,
at least one of the source and drain electrode layers covers entire top and side faces of the silicide layer, and
the fin structure is made of silicon and the amorphous layer is made of a semiconductor material different from silicon.

10. The method of claim 9, wherein the semiconductor material is one of SiP, SiC and SiCP.

11. The method of claim 9, wherein the semiconductor material is one of SiGe and SiGeB.

12. The method of claim 9, wherein the forming the recrystallized layer is performed at a temperature of 500° C. to 650° C.

13. The method of claim 9, wherein in forming the silicide layer, part of the recrystallized layer is formed into the silicide layer.

14. The method of claim 9, wherein:
the gate structure is a dummy gate structure, and
the method further comprises:
removing the dummy gate structure after ing the source and drain electrode layers to form an opening; and
forming a metal gate structure in the opening.

* * * * *